United States Patent
Riedel et al.

(10) Patent No.: US 7,868,679 B2
(45) Date of Patent: Jan. 11, 2011

(54) CIRCUIT, METHOD FOR RECEIVING A SIGNAL, AND USE OF A RANDOM EVENT GENERATOR

(75) Inventors: Thorsten Riedel, Dresden (DE); Jeannette Zarbock, Dresden (DE); Tilo Ferchland, Dresden (DE)

(73) Assignee: Atmel Automotive GmbH, Heilbronn (DE)

(*) Notice: Subject to any disclaimer, the term of this patent is extended or adjusted under 35 U.S.C. 154(b) by 0 days.

(21) Appl. No.: 12/481,249

(22) Filed: Jun. 9, 2009

(65) Prior Publication Data

US 2009/0302920 A1 Dec. 10, 2009

Related U.S. Application Data

(60) Provisional application No. 61/060,635, filed on Jun. 11, 2008.

(30) Foreign Application Priority Data

Jun. 9, 2008  (DE) .................. 10 2008 027 391

(51) Int. Cl.
*H03H 11/26* (2006.01)
(52) U.S. Cl. .................. 327/261; 327/263; 327/276
(58) Field of Classification Search .................. 327/261, 327/263, 269–271, 276–277, 284
See application file for complete search history.

(56) References Cited

U.S. PATENT DOCUMENTS

| 4,438,501 | A |  | 3/1984 | Weber |
| 5,699,005 | A |  | 12/1997 | Menkhoff et al. |
| 5,909,144 | A |  | 6/1999 | Puckette et al. |
| 6,150,863 | A | * | 11/2000 | Conn et al. .................. 327/270 |
| 6,268,725 | B1 | * | 7/2001 | Vernon et al. ............... 324/253 |
| 6,737,904 | B1 |  | 5/2004 | Butaud et al. |
| 7,305,020 | B2 |  | 12/2007 | Tran et al. |
| 7,333,527 | B2 | * | 2/2008 | Greenstreet et al. ......... 375/130 |
| 2009/0327664 | A1 | * | 12/2009 | Yoshimi ..................... 712/221 |

FOREIGN PATENT DOCUMENTS

| DE | 44 42 403 A1 | 9/1996 |
| DE | 195 17 265 A1 | 11/1996 |
| DE | 697 20 305 T2 | 12/2003 |
| JP | 2003-153526 | 5/2003 |

* cited by examiner

*Primary Examiner*—An T Luu
(74) *Attorney, Agent, or Firm*—Muncy, Geissler, Olds & Lowe, PLLC

(57) ABSTRACT

A circuit is provided that includes an input for a clock signal, a random event generator for outputting a random signal, in particular random numbers, a settable delay device that is connected to the input for the clock signal and is connected to the random event generator for the purpose of setting a delay of an edge of the clock signal (clk) by means of the random signal.

11 Claims, 3 Drawing Sheets

CIRCUIT, METHOD FOR RECEIVING A SIGNAL, AND USE OF A RANDOM EVENT GENERATOR

This nonprovisional application claims priority to German Patent Application No. 10 2008 027 391.0, which was filed in Germany on Jun. 9, 2008, and to U.S. Provisional Application No. 61/060,635, which was filed on Jun. 11, 2008, and which are both herein incorporated by reference.

BACKGROUND OF THE INVENTION

Field of the Invention

The present invention relates to a circuit, a method for receiving, and a use of a random event generator.

SUMMARY OF THE INVENTION

An object of the present invention to improve a circuit to the greatest extent possible. Accordingly, a circuit is provided. Preferably, the circuit is monolithically integrated on a semiconductor chip.

The circuit can have an input for a clock signal. A quartz oscillator can be connected to the input. The purpose of the clock signal (clock) is synchronization of digital elements for information processing.

The circuit has a random event generator in order to output a random signal. The random signal can have random numbers. The random signal can be a multi-digit binary random number. The random event generator can also have feedback registers for generating a pseudorandom number as the random signal.

The circuit can have a settable delay device connected to the input for the clock signal. The delay device can be designed to set a delay of an edge of the clock signal. The setting of the delay is a function of the random signal of the random event generator. The delay device can be connected to the random event generator for this purpose.

A method is also provided for receiving a signal. The signal can be a radio signal that is received through an antenna.

In the method, a clock signal can be generated. A quartz oscillator may be provided to generate the clock signal, for example. The purpose of the clock signal is synchronization of digital elements for information processing.

During reception of the signal, a random signal is continuously generated as a function of the clock signal. It is advantageous for the random signal to be generated periodically. The random signal is advantageously generated at every period of the clock signal. According to another advantageous embodiment, the random signal is generated after several periods of the clock signal.

As a function of the random signal, a rising edge or a falling edge of the clock signal can be delayed by a discrete delay value associated with the random signal. The delay value is preferably less than half the period of the clock signal.

The invention has the additional object of specifying a use of a random event generator. Accordingly, a use is provided of a random event generator and of a settable delay device connected to the random event generator for delaying an edge of a clock signal. The delay takes place with discrete delay values as a function of a random signal, so that harmonics of the clock signal have a reduced interference amplitude in a receiving band of a receiver.

The improvements described below refer to the circuit as well as to the use and to the method. In particular, improvements of the method and of the use arise from functions of the circuit.

According to an embodiment, provision is made that the settable delay device can have switchable delay paths with delay elements for setting discrete delay values.

The delay device for switching the delay paths can have demultiplexers and/or multiplexers connected to the delay elements. The demultiplexers can be connected ahead of the delay paths. The multiplexers can be connected after the delay paths. If a multiplexer is used, it is preferable for delay elements to be provided that delay switchover of the multiplexer by a time value, for example a quarter period of the clock signal, in order to prevent glitches.

According to an embodiment, only a rising edge of the clock signal can be delayed by the settable delay device. A rising edge here is the transition from a low voltage to a high voltage of the clock signal. The random event generator is designed to provide the random signal with a falling edge. The provision of the random signal serves to set the delay here.

According to an embodiment, only a falling edge of the clock signal can be delayed by the settable delay device. A falling edge here is the transition from a high voltage to a low voltage of the clock signal. The random event generator is designed to provide the random signal with a rising edge. The provision of the random signal again serves to set the delay.

Provision can be made such that the settable delay device and/or the random event generator can be designed to deactivate the random-event-dependent delay and/or to set a constant delay. It is advantageous for the deactivation or setting of a constant delay to take place as a function of a control signal.

According to an embodiment, provision is made that the random event generator can be designed to delay a plurality of successive edges with a value of the random signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
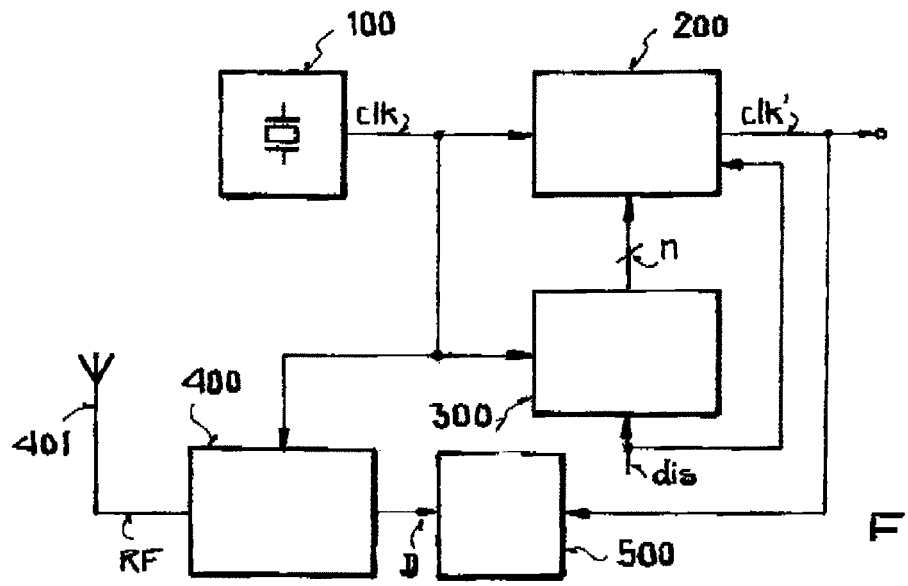
FIG. 1 is a schematic block diagram of a circuit.

In FIG. 1, a circuit is schematically represented by a block diagram. A clock generator circuit 100, with a highly accurate quartz oscillator, is provided. The clock generator circuit 100 produces the clock signal clk. The clock signal clk arrives at a transmitter/receiver circuit that has an analog receiver section 400. The input of the analog receiver section 400 is or can be connected to an antenna 401 in order to receive a radio signal RF.

To receive the radio signal RF, a signal for down-conversion of the radio signal RF is generated from the clock signal clk. For receiving, the analog receiver section 400 has a PLL (Phase-Locked Loop), for example, for which the clock signal clk constitutes a reference. The PLL drives the mixer for down-converting the radio signal.

For this purpose, the clock signal clk can be amplified or attenuated or divided by a frequency divider, for example. In addition, the analog receiver section 400 has an analog-to-digital converter for producing digital signals D. The digital signals D are evaluated in a digital receiver section 500 connected following the analog receiver section 400. For this purpose, the digital receiver section 500 is likewise supplied with a clock signal clk'.

The digital receiver section 500 is a large digital module on the semiconductor chip that produces harmonics corresponding to the clock signal clk', which could interfere with the analog receiver section 400 and thus with the received radio signal RF. This could significantly degrade the input sensitivity of the analog receiver section 400. Interfering signals from harmonics in the receiving band with high amplitude can be especially disruptive in this regard. A significant reduction of an amplitude of a spectral portion of the harmonics in the receiving band should be achieved as compared to a highly accurate clock source, such as the clock generator circuit 100 with the clock signal clk.

The settable delay device 200 and the random event generator 300 produce a (quasi) random time offset in clock edges of the clock signal clk', thus reducing the spectral portion of the harmonics in the receiving band. In this way, an attenuation of the interference components in the receiving band (useful band) is achieved.

The random event generator 300 is connected to the settable delay device 200 by an n-bit wide line, by means of which random signals—in particular in the form of random numbers—are transmitted and a delay value is set. In addition, the random event generator 300 and the delay device 200 have an input to which a control signal dis can be applied for activating and deactivating the random event generator 300 and/or the delay device 200. For the transmit case, the random-event-generator-dependent delay can be switched off or set to a constant delay value in this way by the settable delay device 200.

Figure 2:
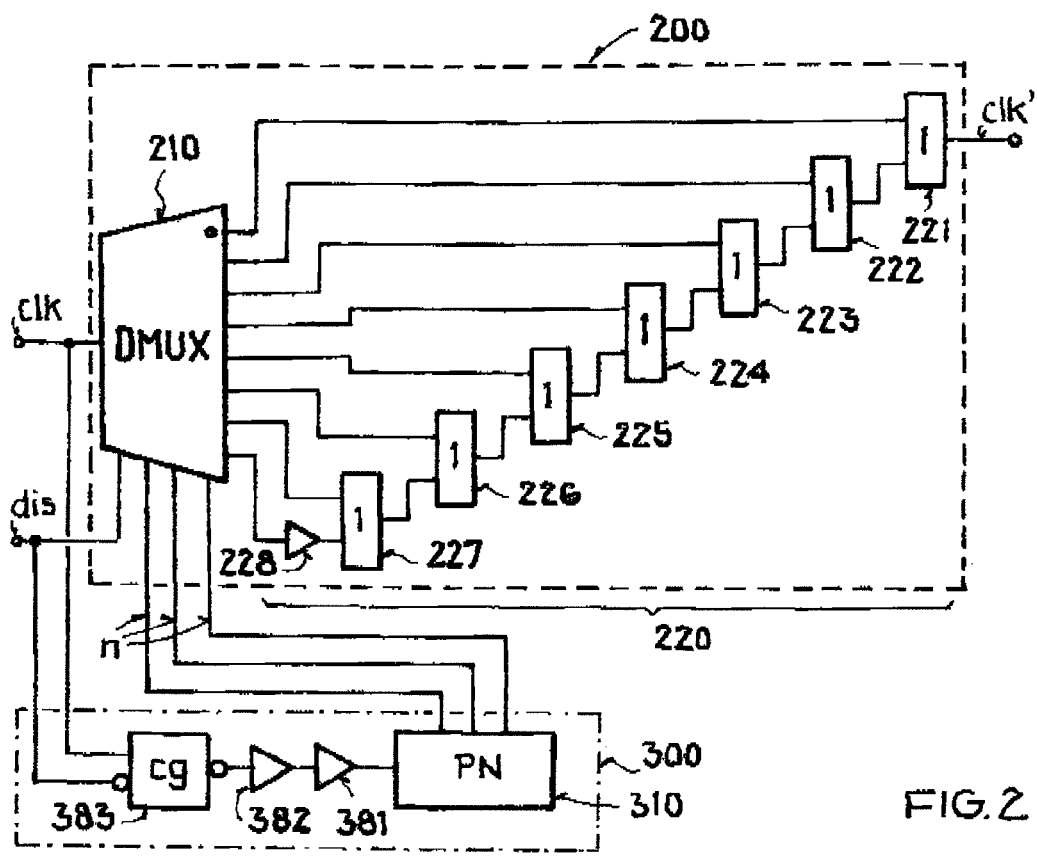
FIG. 2 is a schematic block diagram with delay device and random event generator.

An exemplary embodiment of a random event generator 300 and delay device 200 is shown in FIG. 2. The delay device 200 has a delay chain 200 with the delay elements 221, 222, 223, 224, 225, 226, 227, and 228, wherein the delay elements 221 through 227 are designed as OR gates. One input of each OR gate 221 through 227 and the input of the delay element 228 are connected to an output of a demultiplexer 210 for selecting the delay path. The delay path here can pass through a single delay element 221, through all delay elements 221 through 228, or through a number between one and all delay elements 221 through 228, in order to set a delay value.

The delay can be set at a fixed value or can be controlled by the random event generator 300. For this purpose, the random event generator 300 has a random number generator 310 (PN) that outputs a multi-digit binary random number at its output to the demultiplexer 210. In the example embodiment shown in FIG. 2, an n-wide connection is provided between the random number generator 310 and the demultiplexer 210, permitting a three-digit binary number to be output. It is possible to switch among eight delay paths by means of these three bits.

One input of the random event generator 300 is connected to the input of the demultiplexer 210 for the highly accurate clock signal clk. The clock signal clk arrives at the random number generator 310 through a clock gating cell 383 (cg) with an inverting output and through two delay elements 381 and 382. The clock gating cell 383 makes it possible for the random number generator 310 to not be clocked when the random signal is not used. In this way, the power consumption can be reduced for a longer battery run time.

The delay device 200 and the random event generator 300 are designed such that the rising edge of the clock signal clk is not delayed, or is delayed by a constant delay value, by the delay device 200. To this end, for a rising edge the output value of the random event generator is set to a predetermined signal, for example 0 0 0. For a falling edge, the random number from the random number generator 310 is output. The falling edge of the delayed clock signal clk' in this case is not delayed or else is delayed by a constant value.

The demultiplexer 210 and the random event generator 300 have a control input for application of a control signal dis. The control signal dis serves to activate and deactivate the random-event-dependent delay. For this purpose, the clock gating cell 383 should be disabled at its inverted input by a high value of the control signal dis. At the same time, the demultiplexer 210 is constantly set to a delay path—for example, exclusively through the delay element 221—by the control signal dis.

The circuit in the example embodiment in FIG. 2 has the advantage that the effect of digital blocks on the input sensitivity of receiver circuits is reduced. The controlled clock jitter achieved by the circuit in FIG. 2 has the surprising effect that it is glitch-free. Moreover, the example embodiment shown in FIG. 2 permits a very simple and economical implementation.

As an alternative to the exemplary embodiment in FIG. 2, a circuit can also be implemented with no demultiplexer. For example, one input of each delay element 221 through 228 is connected to the clock signal clk through a switch, for example a transmission gate or an AND gate, instead of through the demultiplexer (not shown). Each applicable switch is connected to one output of the random event generator. In order to produce a random signal, precisely one output of the random event generator emits a control voltage to turn on the switch. For eight delay paths in this alternative exemplary embodiment (not shown), eight control lines from the random event generator to the eight switches are required.

Figure 3:
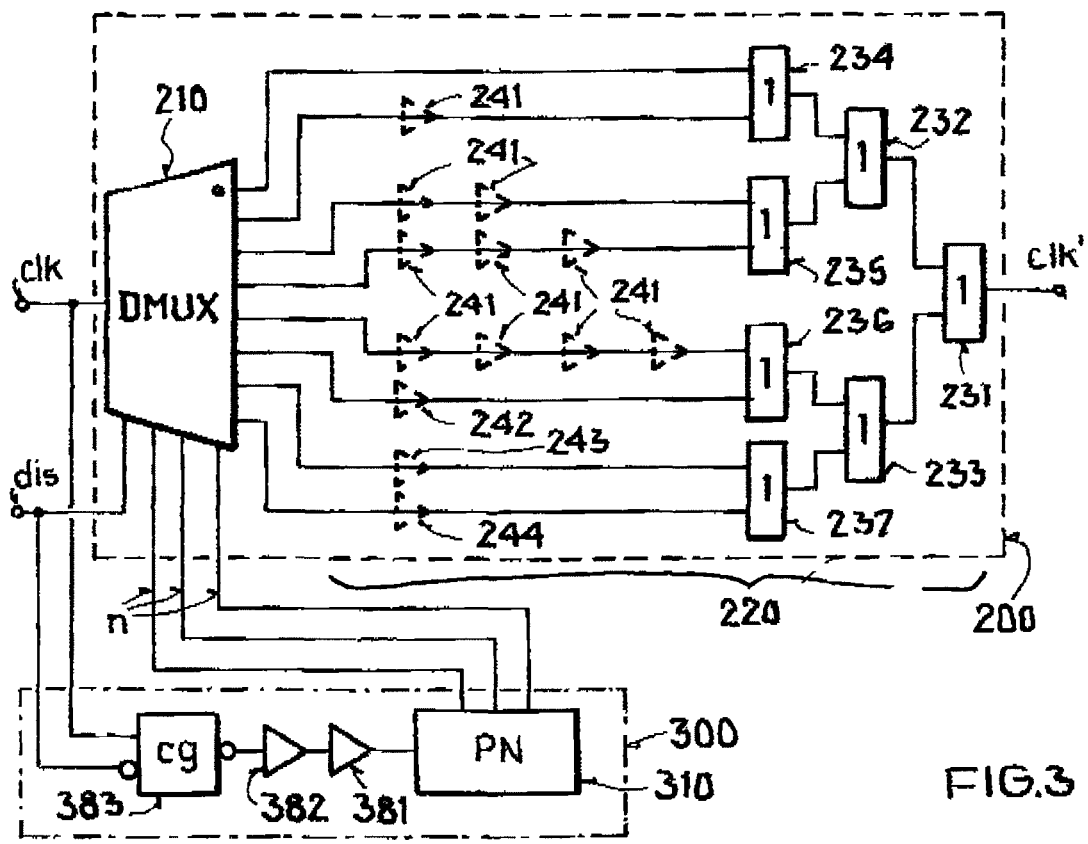
FIG. 3 is another schematic block diagram with delay device and random event generator.

Another exemplary embodiment is shown schematically in FIG. 3. Here, the random event generator 300 and the demultiplexer 210 are identical in design to those in the exemplary embodiment in FIG. 2. Only the delay chain 220 is implemented differently. Seven OR gates 231, 232, 233, 234, 235, 236, 237 combine the signals of the delay paths with the output in order to output the delayed clock signal clk'. The delay through the OR gates 231 through 237 is the same for all delay paths in this arrangement.

Different delays through individual delay paths are achieved through the additional delay elements 241, 242, 243, 244. The delay elements 241 here have identical delays, so that a number of identical delay elements 241 are connected in series for a difference in the delay of the applicable path. Alternatively or in combination (as shown in FIG. 3), different delay elements 242, 243, 244 with different delays may be connected. For example, the delay value of a delay element 242, 243, 244 can be defined by a capacitor, wherein the capacitance value is different for different delay elements 242, 243, 244.

Figure 4:
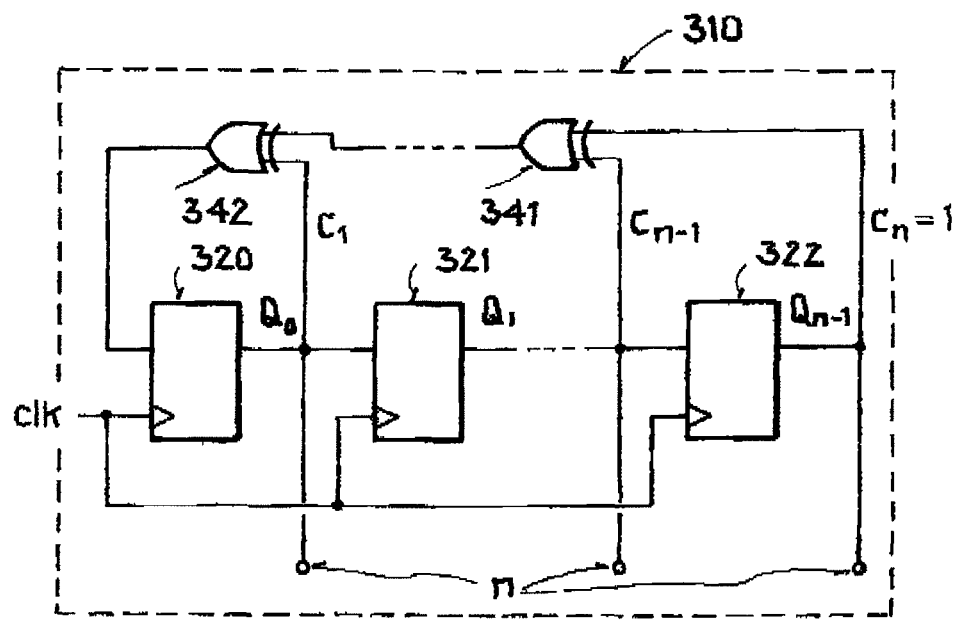
FIG. 4 is a schematic circuit diagram of a random event generator.

A simple way to generate a random number is shown by way of example in FIG. 4. The most uniform possible distribution of the approximation is achieved here. In the example embodiment shown in FIG. 4, a generation of random numbers by feedback shift registers 320, 321, 322 is schematically represented as an example circuit. The feedback shift registers 320, 321, 322 have taps at specific points from which the feedback value is calculated. The mathematical theory on which this principle is based is known as Galois field theory. Each feedback shift register 320, 321, 322 has a characteristic polynomial that determines its behavior. The characteristic polynomials that produce a bit sequence with maximum length are known as primitive polynomials. For example, the polynomial:

$$P(x)=x^3 \oplus x \oplus 1$$

produces a bit sequence with the length $2^3-1=7$, where $a \oplus b$ represents an exclusive-OR combination. For a primitive polynomial of order n, the length of the bit sequence is $2^n-1$. While this bit sequence is deterministic, it only repeats itself for orders n after many cycles, for example 512. Therefore, the bit sequence can also be called a pseudorandom bit sequence. If the i-th coefficient $c_i=1$ in FIG. 4, a tap is used at the location i and is combined with the feedback value through an XOR gate 341, 342. Otherwise, no tap or XOR gate is used at this point.

Figure 5:
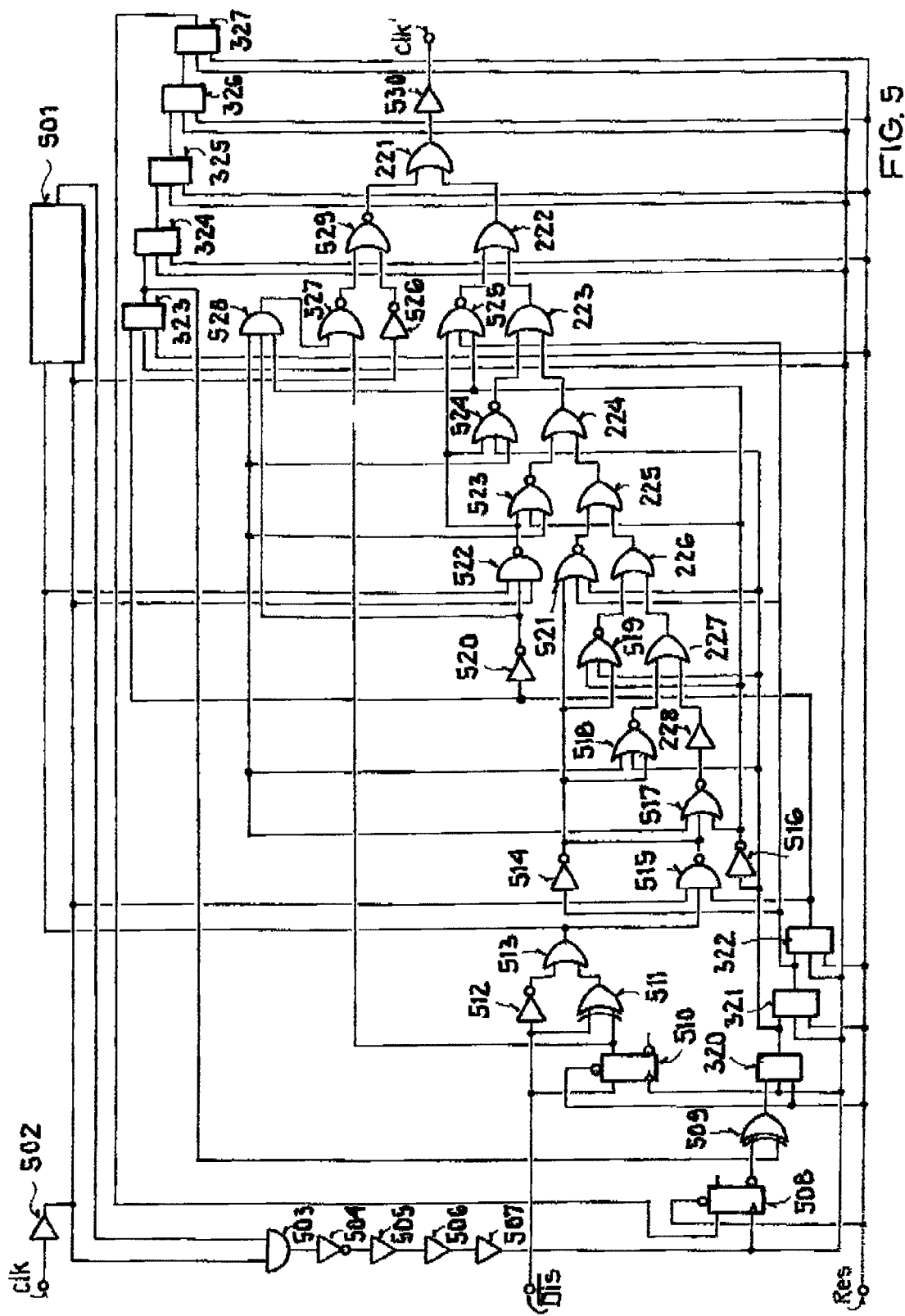
FIG. 5 is a detailed wiring diagram of a circuit.

A detailed representation of an example embodiment of a circuit is shown in FIG. 5. Here, a number of registers 320, 321, 322, 323, 324, 325, 326, 327 and XOR gates 509, 511 of a random event generator are provided. Clock gating for the random event generator is produced by the latch 501 and the AND gate 503. The delay chain is implemented through the OR gates 221, 222, 223, 224, 225, 226, 227 and the buffer 228. Additional digital elements, such as OR gate 513, buffers 241, 242, 243, 244, 502, 504, 505, 506, 507, 530, AND gates 503, 528, NAND gates 515, 522, NOR gates 517, 518, 519, 521, 523, 524, 525, 527, 529, inverters 504, 512, 514, 516, 520, 526, and flip-flops 508, 510, are provided in order to drive signals, to delay, to control the edge change, and for the control function through the control signal dis.

The invention is not restricted to the variant embodiments shown in FIGS. 1 through 5. For example, it is possible to use a multiplexer connected following the delay chain instead of the demultiplexer. Also, a different number of delay paths, for example sixteen delay paths, may be used, for example. The functionality of the circuit from FIG. 1 can be used by preference for a radio network in compliance with the IEEE 802.15.4 industry standard.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   an input for a clock signal;
   a random event generator for outputting a random signal or random numbers; and
   a settable delay device configured to be connectable to the input for the clock signal and connectable to the random event generator for setting a delay of an edge of the clock signal by the random signal,
   wherein only a rising edge or only a falling edge of the clock signal is delayed by the settable delay device, and
   wherein the settable delay device and/or the random event generator are configured to deactivate the random event generator and/or to set a constant delay.

2. The circuit according to claim 1, wherein the settable delay device has switchable delay paths with delay elements for setting discrete delay values.

3. The circuit according to claim 2, wherein the delay device for switching the delay paths has demultiplexers and/or multiplexers connected to the delay elements.

4. The circuit according to claim 1, wherein the random event generator for providing the random signal is configured to set the delay with a falling edge.

5. The circuit according to claim 1, wherein the random event generator is configured to set the settable delay device for delaying a plurality of successive edges with a value of the random signal.

6. A method for receiving a signal, generating a clock signal;
   continuously generating, during reception of the clock signal, a random signal as a function of the clock signal; and
   delaying, as a function of the random signal, an edge of the clock signal by a discrete delay value associated with the random signal,
   wherein only a rising edge or only a falling edge of the clock signal is delayed by the settable delay device, and
   wherein the settable delay device and/or the random event generator are configured to deactivate the random event generator and/or to set a constant delay.

7. A circuit for reducing for reducing amplitude interference in a receiver system, comprising:
   a settable delay device;
   a first clock signal generator outputting a first clock signal to a first input of said receiver system and to said settable delay device; and
   a random event generator for outputting a random signal or random numbers for providing a setting signal to said settable delay device for setting a delay of an edge of the first clock signal,
   wherein only a rising edge or only a falling edge of the first clock signal is delayed by the settable delay device to thereby provide a second clock signal fed to a second input of said receiver system in order to reduce amplitude interference in said receiver system caused by said second clock signal.

8. The circuit according to claim 7, wherein the settable delay device has switchable delay paths with delay elements for setting discrete delay values.

9. The circuit according to claim 8, wherein the delay device for switching the delay paths has demultiplexers and/or multiplexers connected to the delay elements.

10. The circuit according to claim 7, wherein the random event generator for providing the random signal is configured to set the delay with a falling edge.

11. The circuit according to claim 7, wherein the random event generator is configured to set the settable delay device for delaying a plurality of successive edges with a value of the random signal.

* * * * *